Figure 1:
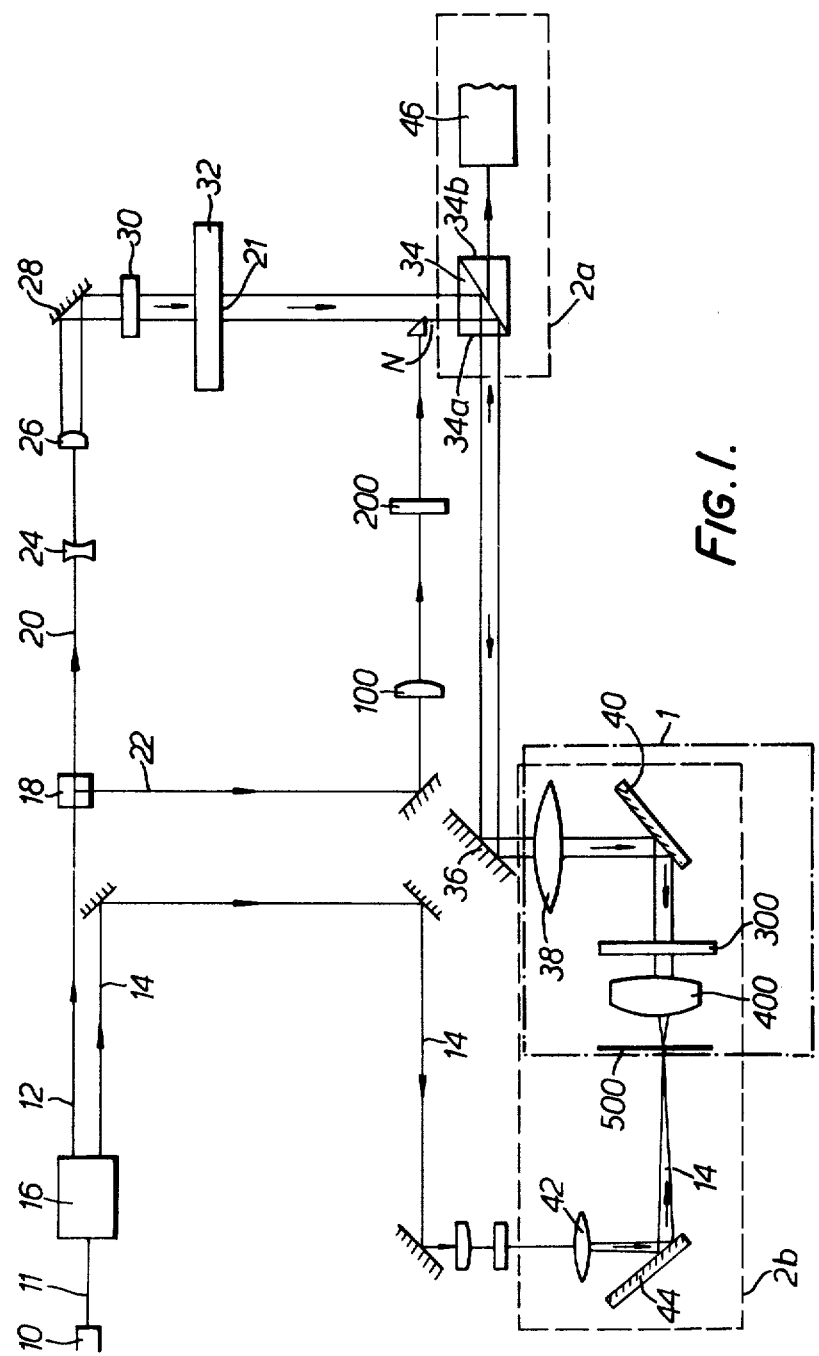

United States Patent [19]

Reid et al.

[11] 4,213,193
[45] Jul. 15, 1980

[54] HOLOGRAPHIC DATA STORAGE SYSTEMS

[75] Inventors: Douglas C. J. Reid, Moulton; Peter Waterworth, Eastcote, Nr. Towcester, both of England

[73] Assignee: Plessey Handel und Investments A.G., Zug, Switzerland

[21] Appl. No.: 898,888

[22] Filed: Apr. 21, 1978

[30] Foreign Application Priority Data

Apr. 23, 1977 [GB] United Kingdom ............... 16973/77

[51] Int. Cl.$^2$ ............................................. G11C 13/04
[52] U.S. Cl. .................................... 365/125; 350/3.77
[58] Field of Search ................ 350/3.5; 365/106, 120, 365/124, 125

[56] References Cited

U.S. PATENT DOCUMENTS

| | | | |
|---|---|---|---|
| 3,812,496 | 5/1974 | Brooks | 365/125 |
| 3,891,975 | 6/1975 | Deml et al. | 365/125 |
| 4,012,108 | 3/1977 | Ishii et al. | 365/125 |
| 4,084,153 | 4/1978 | Otten | 365/125 |

Primary Examiner—Terrell W. Fears
Attorney, Agent, or Firm—Fleit & Jacobson

[57] ABSTRACT

A holographic data storage system for the storage and retrieval of data which includes in combination input means adapted to produce a number of coherent beams; wavefront matching means comprising at least one cylindrical lens for facilitating the discrimination of date; a storage medium adapted to store a number of data tracks, and capable of movement in a plane perpendicular to the plane of incidence; stepping means which is adapted to direct the number of beams produced by the input means on to the storage medium in a manner whereby a number of data tracks are recorded or retrieved, and read out means capable of controllable selective retrieval of date.

8 Claims, 8 Drawing Figures

HOLOGRAPHIC DATA STORAGE SYSTEMS

This invention relates to holographic data storage systems and in particular to the storage and retrival of a number of data tracks recorded on holographic tape.

It is known that high speed digital recording of data i.e. 1 Mbit/sec is difficult using conventional magnetic recording techniques because complex mechanical systems are required to obtain a high recording tape speed relative to the magnetic recording head. Similar problems also exist on replay and retrieval of recorded data.

It is known that optical recording techniques such as holographic recording techniques offer a high packing density and hence lower recording film speeds. Furthermore, the use of holography enables data to be stored in a redundant form so that mechanical tolerances are not severe. However, previously random movement of the storage medium, as opposed to movement in a predetermined direction, has rendered the retrival and discrimination of data difficult. This being partially due to the random movement of the storage medium causing mis-matching of the wavefronts produced at the storage medium thereby altering the reconstruction of the holographic data. Also retrieval of data has proved difficult in systems where reconstructed holograms have been allowed by fall onto an array of photosensitive detectors for example photodiodes. These photodetectors for systems employing moving holograms are usually on a single silicon chip in which the output of each photo detector is connected to a common output. These photodetectors usually require a control signal which in turn causes the photodetectors to transfer their information to the common output. The control signal used is normally a clock signal generated by the system electronics, however, it is possible for a page of data of reconstructed holograms to be misaligned by virtue of the pages not being separated by the calibrated distance of the clock etc., and thereby not read out.

It is an object of the present invention to provide a holographic data storage system incorporating means for allowing controllable retrieval and discrimination of data irrespective of random movement of a storage medium.

According to the invention there is provided a holographic data storage system for the storage and retrieval of data which includes in combination input means adapted to produce a number of coherent beams; wavefront matching means comprising at least one cylindrical lens for facilitating the discrimination of data; a storage medium adapted to store a number of data tracks, and capable of movement in a plane perpendicular to the plane of incidence; stepping means which is adapted to direct the number of beams produced by the input means on to the storage medium in a manner whereby a number of data tracks are recorded or retrieved, and read out means capable of controllable selective retrieval of data.

According to a feature of the holographic data storage system according to the invention, the input means includes a coherent light source capable of producing at least one reference beam, at least one object beam and at least one read out beam; an optical system capable of transforming the at least one object beam into a line of light; and a page composer adapted to produce when illuminated by the line of light multiple object beams each of which is capable of carrying data.

According to another feature of the holographic data storage system according to the invention, the read out means includes a pattern of photodetectors a number of which are formed into arrays having a common electrical output terminal and a number of single photodetectors each one of which has a single electrical output terminal, one of the single photodetectors being adapted to produce a pulse signal capable of activating at least one of the arrays of photodetectors in a manner whereby data received by the array is transferred in a serial manner to the common electrical output terminal such that data can be retrieved.

Preferably one reference beam is used, however multiple reference beams can be used.

Figure 2:
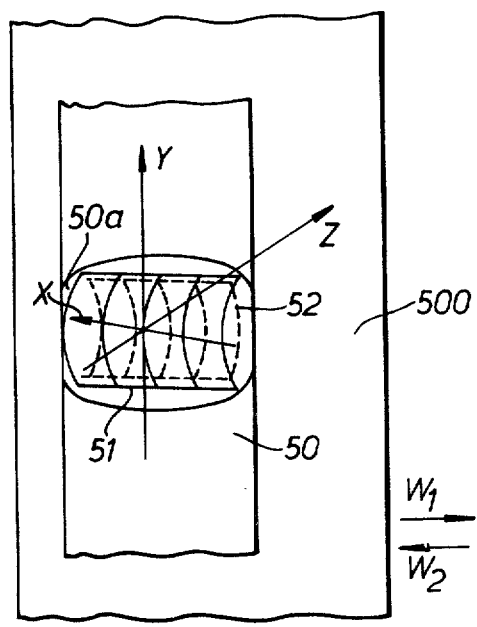
Figure 3:
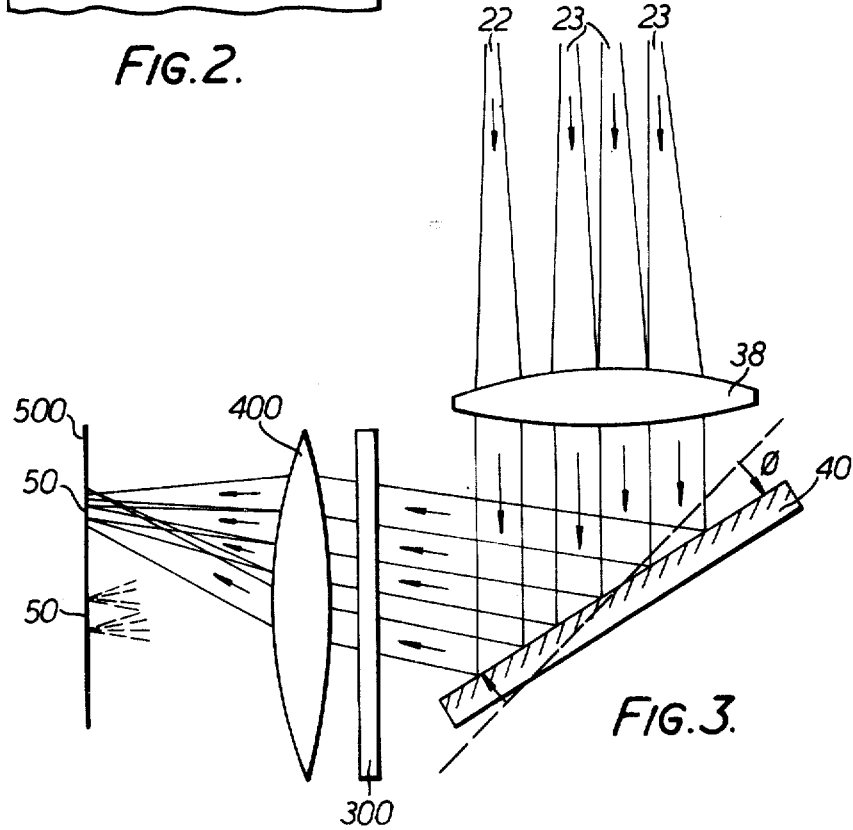
Figure 4:
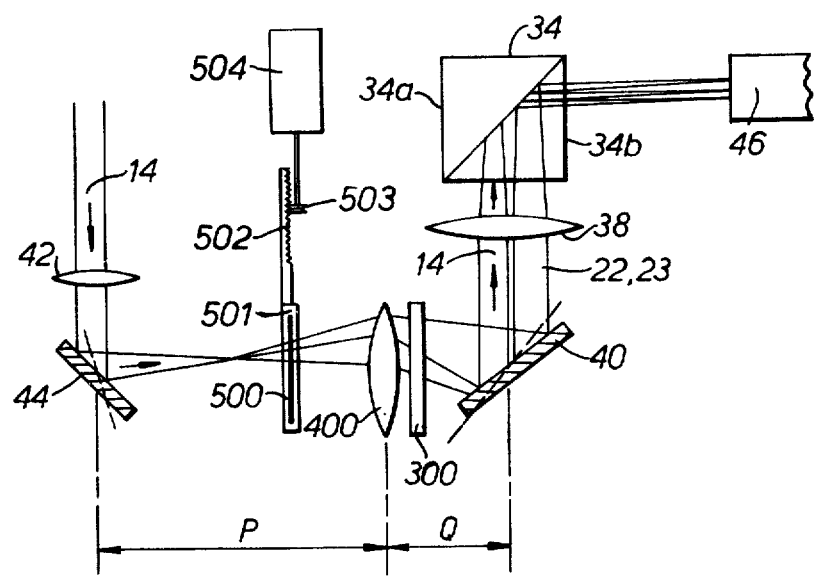
Figure 5:
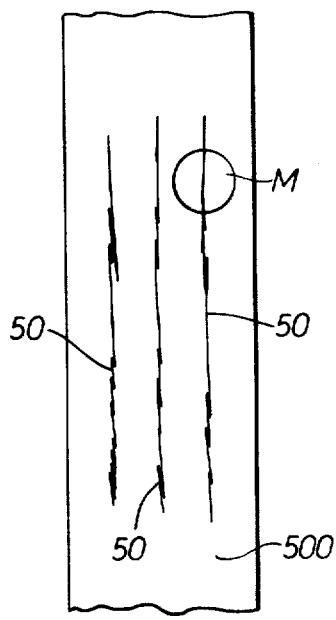
Figure 6:
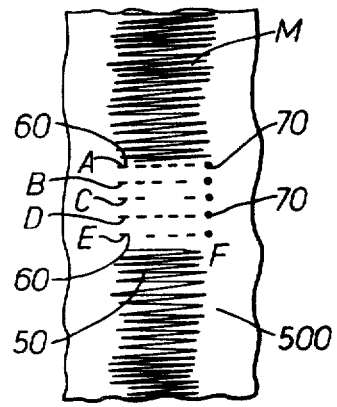
Figure 7:
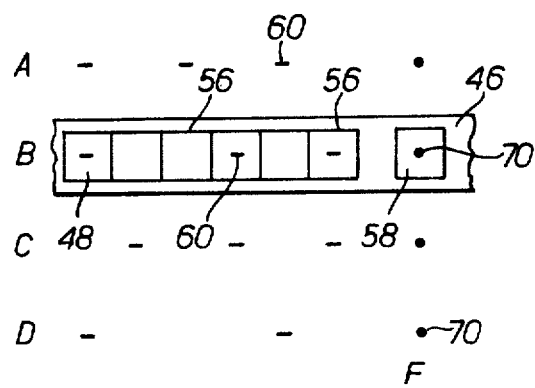
Figure 8:
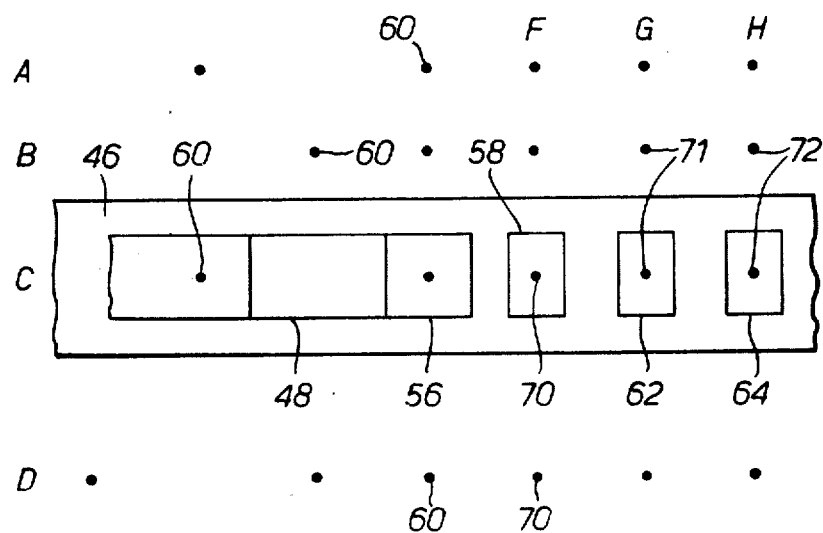

Embodiment of a holographic data storage system according to the invention will now be described by way of example only and with reference to the accompanying drawings in which:

FIG. 1 diagrammatically illustrates in plan view a holographic data storage system according to the invention, FIG. 2 diagrammatically illustrates in elevation a portion of the storage medium incorporated in the holographic data storage system according to the invention, FIG. 3 diagrammatically illustrates the area enclosed by the chain dotted line in FIG. 1, FIG. 4 diagrammatically illustrates the areas enclosed by the dotted lines in FIG. 1, FIG. 5 diagrammatically illustrates in elevation the storage medium of FIG. 2, FIG. 6 diagrammatically illustrates in detail a data track on the storage medium of FIG. 2, FIG. 7 diagrammatically illustrates the pattern of photodetectors which form part of the output means of the holographic data storage system according to the invention, and FIG. 8 diagrammatically illustrates an alternative pattern of photodetectors.

With reference to FIG. 1 of the drawings a holographic data storage system according to the invention consists of input means which include a coherent light source 10 for example, a laser operating in its fundemental mode.

The source 10 is adapted to produce a number of coherent beams 12 and 14, by, for example, passing an original coherent beam 11 through an acousto optic modulator 16. The beam 12 is then passed through a beam splitter 18 to produce a number of beams 20 and 22.

For the purposes of this description the beam 20 will be referred to as the object beam and the beam 22 will be referred as the reference beam.

The object beam 20 is passed through for example two lenses 24 and 26 which effect expansion of the object beam 20 in the plane of incidence i.e. parallel to the plane of the paper. The lens 24 is a diverging of lens which effects divergence the beam 20, and the lens 26 is a converging cylindrical lens which is placed in the path of the beam 20 such that its cylindrical axis is perpendicular to the plane of incidence so that the diameter of the beam is increased in the plane of incidence.

The path of the object beam 20 is then directed by a mirror 28 through a converging cylindrical lens 30 whose cylindrical axis is orthogonal to the lens 26 such that the diameter of the object beam 20 is reduced in a plane perpendicular to the plane of incidence thereby forming a line of light 21.

Interposed in the path of this line of light 21 is a page composer 32 which can for example be constructed from a lanthanum doped lead zirconate-titanate (PLZT) a suitable pattern of conducting electrodes comprising a series of spaced apart apertures arranged on a major surface of the PLZT such that they can be illuminated by the line of light 21.

The effect of the page composer 32 is to transform the line of light 21 into a number of object beams 23, each one of which is capable of carrying date. The number of object beams produced at the page composer 32 varying in dependance upon the number of apertures present in the pattern of the composer 32.

At a point N the object beams 23 and the reference beam 22 are caused to propogate in the same direction. The reference beam 22 having previously been passed through cylindrical lenses 100 and 200 which form part of the wavefront matching means.

The combined action of the wavefront matching means which consists of lenses 100,200, 300 and 400 is to produce at a storage medium 500 a matching of the wavefronts of the object beams 23 and the reference beam 22 such that on formation of a hologram using known techniques ease of discrimination of data is effected.

The lens system of the wavefront matching means can for example comprise two cylindrical lenses 100 and 200 whose cylindrical axes are orthogonally crossed in relation to each other and are placed in the path of the reference beam. A third cylindrical lens 300 whose cylindrical axis is in the plane of incidence and a spherical lens 400 are both placed in the path of the object beams 23 and reference beam 22 prior to the formation of a hologram on a storage medium 500 by known interference techniques of the reference and object beams.

The ease of discrimination of the data can be better understood from FIG. 2 of the drawings in which is shown a storage medium 500 which has formed on a major surface thereof at least one hologram track 50. The hologram track 50 consists of a series of overlapping subholograms. The degree of overlap varying in dependence upon the packing density, the size of the data bits and the speed of movement of the storage medium 500. On one of these subholograms 50a is shown superimposed a diagrammatic representation of wavefronts 51 and 52. The wavefronts 51 represent the wavefront of the reference beam 22 and the wavefronts 52 represent the wavefront of the object beams 23 when they have interferred to produce the hologram 50a.

As can be seen from the diagrammatic representation; the curvature of the wavefronts 51 and 52 are equal and opposite in the plane perpendicular to XZ and equal in the plane of incidence XZ. This means that the curvature of the wavefronts is equal and opposite in the plane of movement of the storage medium 500 which is denoted by the arrow Y. The effect of the matching of the waveform curvatures in the plane of incidence XZ is to produce at the output means a high degree of stability in respect of discrimination of data when the storage medium 500 is caused to move in directions denoted by arrows $W_1$ and $W_2$ i.e. A fourier-type hologram in the plane of incidence. This enabling data to be discriminated from a hologram under reconstruction irrespective of movement of the storage medium in directions $W_1$ and $W_2$. In addition when the storage medium is moved in the direction Y i.e. perpendicular to the plane of incidence XZ due to the wavefronts being equal and opposite a magnification of movement of the reconstructed data is achieved thereby enabling pages of data to be discriminated. Thus the use of cylindrical lenses 100, 200 and 300 decreases the positional sensitivity of the storage medium and facilitates discrimination of data.

To return to FIG. 1 of the drawings at the point N the object beams 23 and the reference beam 22 are caused to propogate in the same direction through a polarizing beam splitter 34. The coherent beams 23 and 22 being polarized in a direction perpendicular to the plane of incidence such that they pass at right angles through the beam splitter 34 to emerge at a face 34a. The beams 22 and 23 are then reflected through 90° by a mirror 36 to a lens 38 and so directed into a scanning means for example a mirror 40 attached to a stepping motor such that mirror is capable of restricted rotation through an angle $\phi$ The scanning means i.e. the mirror 40 is used to direct the object beams 23 and the reference beam 22 on the storage medium 500, via lenses 300 and 400 this can be seen in more detail in FIG. 3 which illustrates the area within the chain dotted line 1.

In FIG. 3 the recording of a number of hologram data tracks 50 is shown, this is achieved by the scanning means 40 which directs the object beams 23 which carry the data and the reference beam 22 such that they interfere in a known manner to produce on a major surface of the storage medium 500, which can for example be made from a photosensitive material, a hologram data track 50. The storage medium 500 is capable of movement in a plane which is perpendicular to the plane of incidence such that a series of sub holograms which overlap are recorded to form a hologram data track 50.

The fact that the scanning means 40 is attached to a stepping motor means that a number of tracks 50 can be recorded by virtue of moving the point of interference of the beams 23 and 22, such that they focus on different spaced apart portions of the major surface of the storage medium 500.

As an alternative to rotation of mirrors 40 and 44 the mirrors can be set in a predetermined position and the storage medium 500 can be stepped in a direction perpendicular to an edge of the film by a suitable motorised stepping mechanism. In a practical embodiment the storage medium 500 is a 16 mm photographic film stored in a cassette form and the cassette and its mounting means are stepped by the motorised stepping mechanism. Referring now to FIG. 4, the cassette 501 (shown only symbolically) is attached to a rack 502 which is stepped by a motor 504 via a pinion 503.

As can be seen in FIG. 1 after the hologram data tracks 50 have been recorded on the storage medium 500 the sub holograms comprising the hologram tracks 50 can be replayed i.e. retrieved.

This is achieved using a reconstructing beam 14 which is in antiparallel replica of the reference beam 22. This can be seen in more detail in FIG. 4 which illustrates the areas 2a and 2b defined by dotted lines.

The reconstructing beam 14 is directed by a series of mirrors and is finally passed through a reconstructing lens 42, this focuses the beam 14 onto another scanning means 44 which is for example, a mirror attached to a stepping motor. The scanning means 44 is positioned with its axis of rotation coincident with the image of the axis of rotation of the scanning means 40 through the lens 400 i.e. the distances P and Q are conjugates of lens 400.

This is done such that the reconstructing beam is an exact anti parallel replica of the reference beam 22.

In addition in order to allow retrieval of data using the reconstructing beam 14 the axis of polarization of the beam 14 is rotated through a right angle using a ½ wave plate so that its axis of polarization is parallel for example to the plane of incidence whereas the coherent beams 23 and 22 are polarized in a direction perpendicular to the plane of incidence. The axis of polarization of the beam 14 is changed so that the data truck under retrieval emerges from a face 34b of the beam splitter 34 and propagates towards a photosensitive detector medium 46 for example a photodiode array, from which the data is retrieved in a controllable selective manner. Using the above method of retrieval the same optical means are used as in the recording of the data tracks.

Also in previous paragraphs the use of only one reference beam has been described this is for simplicity as more than one reference beam may be used. Further we have described the recording and retrieving of data as occuring at different instances of time. However, it must be understood that they can occur simultaneously.

The output means of controllable selective retrieval of information can be better understood with reference to FIGS. 5 to 8 of the drawings.

FIG. 5 depicts a major surface of the storage medium 500 on which are formed a number of hologram data tracks 50. An area defined by M is shown in greater detail in FIG. 6, here the sub holograms comprising the hologram tracks 50 are shown containing a series of rows A B C D and E of spaced-apart data areas 60 and 70. The data areas 70 being parallel with and adjacent to an end portion of each of the rows A B C D and E such that they form a column F. Each of the areas of data 60 and 70 of each of the rows A B C D and E forms a separate page of data, each page being a seperate sub hologram of the hologram track 50.

When the sub hologram i.e. a page of data is deflected on to the photo detection medium 46, controllable selective retrieval of data bits is achieved using a system as shown in FIG. 7. The photodetection medium 46 consists of a single photodiode array, the number of diodes for example corresponding to the number of apertures in the page composer 32 or a number of arrays of diodes which in total have for example the same number of diodes in relation to the apertures of the page composer. The latter system allows a faster speed of response and hence retrieval of information. One of these arrays 48 is shown in FIG. 7, this array 48 has a number of electrical output terminals corresponding to the number of diodes 56 which comprise the array these electrical output terminals being combined to form a single common electrical output terminal. The photodetection medium 46 also includes at least one single photodiode 58 which has a single electrical output terminal. The diode 58 receives and is activated by the data bit 70 which for the purposes of this description will be known as the strobe bit. The strobe bit 70 is always present on each page of data and is recorded in conjunction with the rest of the data bits 60 when the hologram data tracks 50 are recorded at the storage medium 500.

The diode 58 receives the strobe bit 70 and is thereby activated so that it generates a pulse signal which sequentially operates a series of gates which form part of a shift register which is contained in the photodiode array 48. The shift register responds to detected charge in such a way so as to relate to the array 48 that a particular page of data requires to be transferred to the common electrical output associated with the array 48, and thereby retrieved.

The presence of the strobe bit 70 and the corresponding pulse signal generated by the diode 58 ensures that no page of data is unavoidably lost i.e. not retrieved due to mis-alignment of the particular page of data with the photo detection medium 46 as was the case in previous state of the art techniques. The photodetection medium 46 will not respond by transferring its data to the common electrical output terminal unless a strobe bit 70 is present to activate the generation of the pulse signal by the diode 58 i.e. the presence of the strobe bit 70 enables correct synchronism of the data.

With reference to FIG. 8 of the drawings, in addition to the strobe bit 70 it is possible to add a number of other bits which are parallel to and spaced-apart from the rows A B C and D and which form columns G and H. These bits 71 and 72 will for the purposes of this description be known as a parity bit and a block bit respectively.

The parity bit 71 and the block bit 72 each have a single photodiode 62 and 64 associated with them in the photodetection medium 46. The diodes 62 and 64 are similar to the diode 58 in that they each have a single electrical output terminal.

The bits 71 and 72 may be recorded at the same time as the Strobe bit 70 or the block bit can be pre-recorded on to the storage medium 500 prior to the rest of the data being recorded. Also the bits 70, 71 and 72 may be recorded without containing data.

The parity bit 71 acts in conjunction with the diode 62 and thereby the photodiode arrays 48 in such a way as to add up all the 1's present in the data bits 60, and if this number is even, the bit 71 itself becomes a 1, if the number of 1's is odd then the bit 71 becomes a zero or vice versa depending on its predesignated parity constant.

The block bit 72 acts as a counter in that for example a block contains a number of words where a word is 8 bits. The block bit 72 enables identification and location of any page of data in one of the hologram data tracks 50.

As can be seen from the foregoing description of the holographic data storage device according to the invention the presence of the strobe bit and its associated diode enable controllable selective retrieval of information which is enhanced by the wavefront matching achieved at the storage medium by the optical wavefront matching means.

What is claimed is:

1. A holographic data storage system for the storage and retrieval of data which includes in combination input means adapted to produce a number of coherent beams; optical means for converting data into holographic form for illuminating a storage medium, said storage medium being adapted to store a number of data tracks, and capable of movement in a plane perpendicular to the plane of incidence; stepping means which is adapted to direct the number of beams produced by the input means on to the storage medium in a manner whereby a number of data tracks are recorded or retrieved, and read out means capable of controllable selective retrieval of data, in which said optical means comprises a first path for generating at least one reference beam, in which the object beams are directed onto the storage medium with a wavefront having a curvature which is substantially different from the wavefront of the at least one reference beam, thereby allowing said holograms to be overlapped on said storage medium while being discriminatable on replay.

2. A holographic data storage system as claimed in claim 1 in which the storage medium is a length of photographic film and in which the stepping means includes a mechanism for moving the storage medium in a direction perpendicular to its length to produce the number of data tracks.

3. A holographic data storage system as claimed in claim 1 in which the stepping means includes a mechanism for rotating a mirror in the optical system to focus the number of beams onto a number of regions of the storage medium to produce the number of data tracks.

4. A holographic data storage system as claimed in claim 1 in which the input means includes a coherent light source capable of producing at least one reference beam, at least one object beam and at least one read out beam; an optical system capable of transforming the at least one object beam into a line of light and a page composer adapted to produce when illuminated by the line of light multiple object beams each of which is capable of carrying data.

5. A holographic data storage system as claimed in claim 1 in which the read out means includes a pattern of photodetectors a number of which are formed into arrays having a common electrical output terminal and a number of single photodetectors each one of which has a single electrical output terminal, one of the single photodetectors being adapted to produce a pulse signal capable of activating at least one of the arrays of photodetectors in a manner whereby data received by the array is transferred in a serial manner to the common electrical output terminal such that data can be retrieved.

6. A holographic storage system as claimed in claim 5 in which there are three photodetectors with individual outputs, one for a strobe bit, one for a parity bit and one for a block bit.

7. A holographic data storage system as claimed in claim 1 in which the wavefronts are opposite in curvature.

8. A holographic data storage system as claimed in claim 1 in which the wavefronts are substantially equal and opposite in curvature.

* * * * *